United States Patent
Yang (10) Patent No.: US 11,032,946 B1
(45) Date of Patent: Jun. 8, 2021

(54) ELECTRICAL CONNECTOR CAGE ASSEMBLY, ELECTRICAL CONNECTOR, AND ELECTRONIC APPARATUS

(71) Applicant: ALL BEST PRECISION TECHNOLOGY CO., LTD., Taoyuan (TW)

(72) Inventor: Haven Yang, Taoyuan (TW)

(73) Assignee: ALL BEST PRECISION TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 16/816,270

(22) Filed: Mar. 12, 2020

(51) Int. Cl.
| H05K 7/20 | (2006.01) |
| H05K 1/02 | (2006.01) |
| G02B 6/42 | (2006.01) |
| H01L 23/40 | (2006.01) |
| H01L 23/367 | (2006.01) |

(52) U.S. Cl.
CPC ....... H05K 7/20418 (2013.01); G02B 6/4269 (2013.01); G02B 6/4284 (2013.01); H05K 1/0203 (2013.01); H01L 23/3672 (2013.01); H01L 23/4093 (2013.01); H05K 7/2049 (2013.01)

(58) Field of Classification Search
CPC ............ H05K 7/20418; H05K 7/2049; H05K 1/0203; H01L 23/367–3672; H01L 23/4093; H01R 13/6581; H01R 24/28; H01R 24/64; H01R 25/006; H01R 2107/00; G02B 6/4266–4273
See application file for complete search history.

(56) References Cited

U.S. PATENT DOCUMENTS

| 7,274,571 B2* | 9/2007 | Wei ...................... H05K 7/1461 165/104.26 |
| 9,739,959 B2* | 8/2017 | Masahiko ................ G02B 6/32 |
| 9,787,034 B2* | 10/2017 | Yang .................... G02B 6/3817 |
| 2018/0115119 A1* | 4/2018 | Little .................. H01R 13/6658 |
| 2020/0309458 A1* | 10/2020 | Chen .................... G02B 6/4269 |

* cited by examiner

Primary Examiner — Zachary Pape
(74) Attorney, Agent, or Firm — Winston Hsu (57) ABSTRACT

An electrical connector cage assembly includes a connector casing, a heat-dissipating structure, and a light-guiding part. The heat-dissipating structure is disposed on an outer side wall of the connector casing and includes a base portion and a plurality of fins protruding from the base portion and extending parallel to each other and the base portion. One of the fins protrudes relative to the base portion longer than another one, so that an accommodating space is formed above the shorter fin and extends parallel to the fins. The light-guiding part is disposed above the heat-dissipating structure. A light-guiding rod body of the light-guiding part is accommodated in the accommodating space. An electrical connector uses the electrical connector cage assembly. An electronic apparatus includes the electrical connector and an apparatus casing. A light-output portion of the light-guiding part is disposed toward a light-permeable structure of a panel of the apparatus casing.

18 Claims, 11 Drawing Sheets

ELECTRICAL CONNECTOR CAGE ASSEMBLY, ELECTRICAL CONNECTOR, AND ELECTRONIC APPARATUS

BACKGROUND OF THE INVENTION

1. Field of the Invention

The present invention relates to an electrical connector, and more particularly to an electrical connector with a heat-dissipating structure.

2. Description of the Prior Art

Electrical connectors are used widely in applications for power or signal connection, for example for connecting an electronic host device with an external device. As the transfer rate of the electrical connector is higher and higher, the electronic connector generates more and more heat. For this issue, heat-dissipating fins can be disposed on the outer casing of the electrical connector for convenience of heat dissipation. In some applications, the connector is equipped with an indication lamp in order to externally indicate the operating status of the connector. The indication lamp uses a light-guiding part to guide light emitted by a light source. In principle, the light-guiding part will be disposed close to the outer casing of the connector, resulting in structural interference between the light-guiding part and the heat-dissipating fins. In some structural configurations, the heat-dissipating fins are disposed at the up side of the outer casing of the connector, and the light-guiding part is also disposed at the up side of the outer casing of the connector. Such structural configuration reduces the heat dissipation effect of the heat-dissipating fins because fins at the location where the light-guiding part is disposed have to be removed. Furthermore, in some structural configurations, the heat-dissipating fins are disposed at the up side of the outer casing of the connector, and the light-guiding part is disposed at the left or right side of the outer casing of the connector. Such structural configuration increases the overall width of the connector.

SUMMARY OF THE INVENTION

An objective of the invention is to provide an electrical connector cage assembly, which has a heat-dissipating structure and a light-guiding part. Fins of the heat-dissipating structure form an accommodating space by a height difference so as to accommodate the light-guiding part.

An electrical connector cage assembly according to the invention includes a connector casing, a heat-dissipating structure, and a light-guiding part. The connector casing has an outer side wall. The heat-dissipating structure is disposed on the outer side wall and includes a base portion and a first fin and at least one second fin that protrude from the base portion. The first fin and the at least one second fin extend parallel to each other and the base portion. The first fin protrudes relative to the base portion longer than the at least one second fin, so that an accommodating space is formed above the at least one second fin. The accommodating space extends parallel to the first fin and the at least one second fin. The light-guiding part is disposed above the heat-dissipating structure. The light-guiding part includes a light-guiding rod body. The light-guiding rod body is accommodated in the accommodating space. Thereby, the heat-dissipating structure accommodates the light-guiding rod body by the height difference between the fins, so that the volume of the electrical connector cage assembly will not obviously increase even though the electrical connector cage assembly is equipped with the heat-dissipating structure and the light-guiding part; besides, the fins corresponding to the light-guiding part do not need to be removed entirely, so the influence on the heat dissipation of the heat-dissipating structure due to the disposition of the light-guiding part can be reduced.

Another objective of the invention is to provide an electrical connector, which includes the above electrical connector cage assembly, in which the fins of the heat-dissipating structure form an accommodating space by a height difference so as to accommodate the light-guiding part.

An electrical connector according to the invention includes a circuit board, an electrical connector cage assembly, and an electrical connector base. The electrical connector cage assembly is fixed on the circuit board. The electrical connector cage assembly includes a connector casing, a heat-dissipating structure, and a light-guiding part. The connector casing has an outer side wall and forms an insertion slot. The heat-dissipating structure is disposed on the outer side wall and includes a base portion and a first fin and at least one second fin that protrude from the base portion. The first fin and the at least one second fin extend parallel to each other and the base portion. The first fin protrudes relative to the base portion longer than the at least one second fin, so that an accommodating space is formed above the at least one second fin. The accommodating space extends parallel to the first fin and the at least one second fin. The light-guiding part is disposed above the heat-dissipating structure. The light-guiding part includes a light-guiding rod body. The light-guiding rod body is accommodated in the accommodating space. The electrical connector base is electrically connected onto the circuit board in the connector casing and exposed in the insertion slot. Similarly, the heat-dissipating structure accommodates the light-guiding rod body by the height difference between the fins, so that the volume of the electrical connector will not obviously increase even though the electrical connector cage assembly is equipped with the heat-dissipating structure and the light-guiding part; besides, the fins corresponding to the light-guiding part do not need to be removed entirely, so the influence on the heat dissipation of the heat-dissipating structure due to the disposition of the light-guiding part can be reduced.

Another objective of the invention is to provide an electronic apparatus, which includes the above electrical connector cage assembly, in which the fins of the heat-dissipating structure form an accommodating space by a height difference so as to accommodate the light-guiding part.

An electronic apparatus according to the invention includes an apparatus casing, a circuit board, an electrical connector cage assembly, and an electrical connector base. The apparatus casing includes a panel. The panel has a light-permeable structure. The circuit board is disposed in the apparatus casing. The electrical connector cage assembly is fixed on the circuit board. The electrical connector cage assembly includes a connector casing, a heat-dissipating structure, and a light-guiding part. The connector casing has an outer side wall. The heat-dissipating structure is disposed on the outer side wall and includes a base portion and a first fin and at least one second fin that protrude from the base portion. The first fin and the at least one second fin extend parallel to each other and the base portion. The first fin protrudes relative to the base portion longer than the at least one second fin, so that an accommodating space is formed above the at least one second fin. The accommodating space extends parallel to the first fin and the at least one second fin. The light-guiding part is disposed above the heat-dissipating structure. The light-guiding part includes a light-guiding rod body and a light-output portion. The light-guiding rod body is accommodated in the accommodating space. The light-output portion is connected to an end portion of the light-guiding rod body toward the light-permeable structure. The electrical connector base is electrically connected onto the circuit board in the connector casing and exposed in the insertion slot. Similarly, the heat-dissipating structure accommodates the light-guiding rod body by the height difference between the fins, so that the volume of the electrical connector will not obviously increase even though the electrical connector is equipped with the heat-dissipating structure and the light-guiding part; besides, the fins corresponding to the light-guiding part do not need to be removed entirely, so the influence on the heat dissipation of the heat-dissipating structure due to the disposition of the light-guiding part can be reduced.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 1 to FIG. 4. An electrical connector 1 of an embodiment according to the invention includes a circuit board 12, two electrical connector bases 14, and an electrical connector cage assembly 16. The electrical connector cage assembly 16 is fixed on the circuit board 12. The two electrical connector bases 14 are electrically connected onto the circuit board 12 in the electrical connector cage assembly 16 and are shown in solid blocks in the drawings for simplification of drawing. In practice, the two electrical connector bases 14 can be structurally integrated into one single structure part for easy assembly. The electrical connector cage assembly 16 includes a connector casing 162, two heat-dissipating structures 164, an elastic attaching part 166, and two light-guiding parts 168. The heat-dissipating structures 164 are disposed on the connector casing 162. The elastic attaching part 166 is engaged to the connector casing 162 so as to elastically clamp the two heat-dissipating structures 164 between the elastic attaching part 166 and the connector casing 162. The two light-guiding parts 168 are disposed in accommodating spaces (which will be described in the following) of the two heat-dissipating structures 164 respectively. The light-guiding part 168 can guide light emitted by a light source (for example but not limited to including a plurality of light-emitting diodes disposed inside a light-blocking sheath 122) on the circuit board 12, for indicating the operating status of the electrical connector 1. Using a part of the heat-dissipating structure 164 to form an accommodating space to accommodate the light-guiding part 168 can avoid an excessive volume of the electrical connector 1 and also can reduce the influence on the heat dissipation of the heat-dissipating structure 164 due to the disposition of the light-guiding part 168.

In the embodiment, the connector casing 162 has four outer side walls 162a-d and a partition plate 162e. The outer side walls 162a-d are connected together to form a receiving space 1620. The partition plate 162e is connected to the outer side walls 162a and 162c inside the receiving space 1620 to divide the receiving space 1620 into two insertion slots 1622. The two electrical connector bases 14 are exposed in the two insertion slots 1622 respectively. The insertion slot 1622 has an inlet 1622a. An external matching electrical connector can be inserted into the insertion slot 1622 through the inlet 1622a to be engaged to the corresponding electrical connector base 14. The heat-dissipating structures 164 are disposed on the outer side wall 162a.

The heat-dissipating structure 164 includes a base portion 1642 and a plurality of fins 1644 protruding from the base portion 1642. The fins 1644 extend parallel to each other and the base portion 1642. From another aspect, the fins 1644 extends both a first direction D1 (indicated by an arrow in FIG. 4) and a second direction D2 (indicated by a double-head arrow in FIG. 4). The fins 1644 form an accommodating space by a height difference to accommodate the light-guiding part 168. Please also refer to FIG. 5. The fins 1644 include a first fin 1644a and at least one second fin 1644b. The first fin 1644a protrudes relative to the base portion 1642 longer than the at least one second fin 1644b, so that a first accommodating space 1646 (indicated by a dashed frame in FIG. 5) is formed above the at least one second fin 1644b. The first accommodating space 1646 extends parallel to the first fin 1644a and the at least one second fin 1644b. In the embodiment, the base portion 1642 roughly shows a flat structure. A protruding height H1 of the first fin 1644a from an upper surface 1642a of the base portion 1642 in the first direction D1 is larger than a protruding height H2 of the second fin 1644b from the upper surface 1642a of the base portion 1642 in the first direction D1, so the portion of the first fin 1644a protruding relative to the second fin 1644b and the at least one second fin 1644b form the first accommodating space 1646 therebetween. The first accommodating space 1646 extends in the second direction D2. Furthermore, in practice, depending on the shape of the upper surface 1642a of the base portion 1642, the protruding height H1 of the first fin 1644a may be less than the protruding height H2 of the second fin 1644b, but the first fin 1644a still can protrude relative to the second fin 1644b, which also can form the first accommodating space 1646 and will not be repeated in addition.

Figure 5:
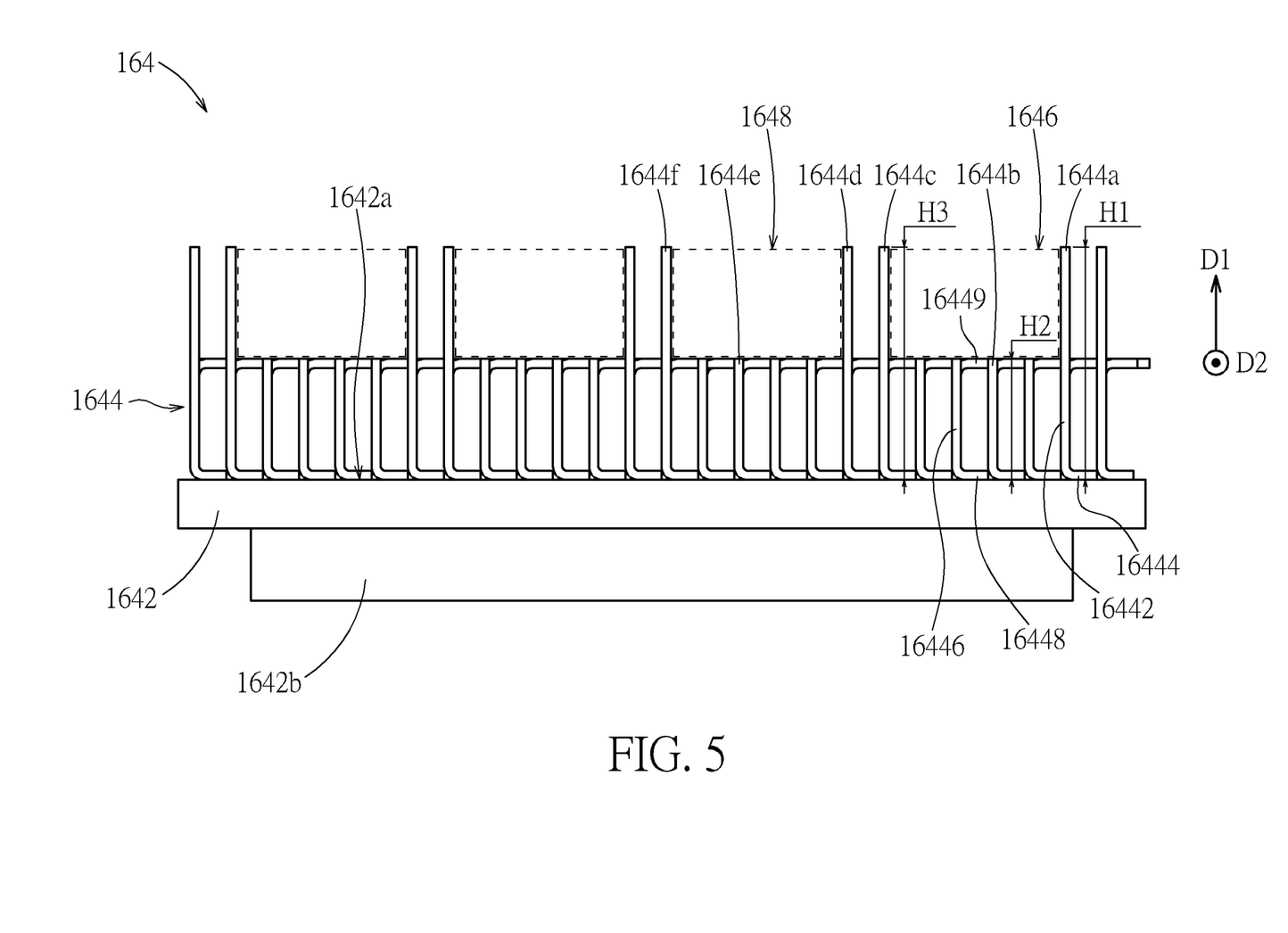
FIG. 5 is a front view of one of heat-dissipating structures of the electrical connector cage assembly in FIG. 4.
Figure 6:
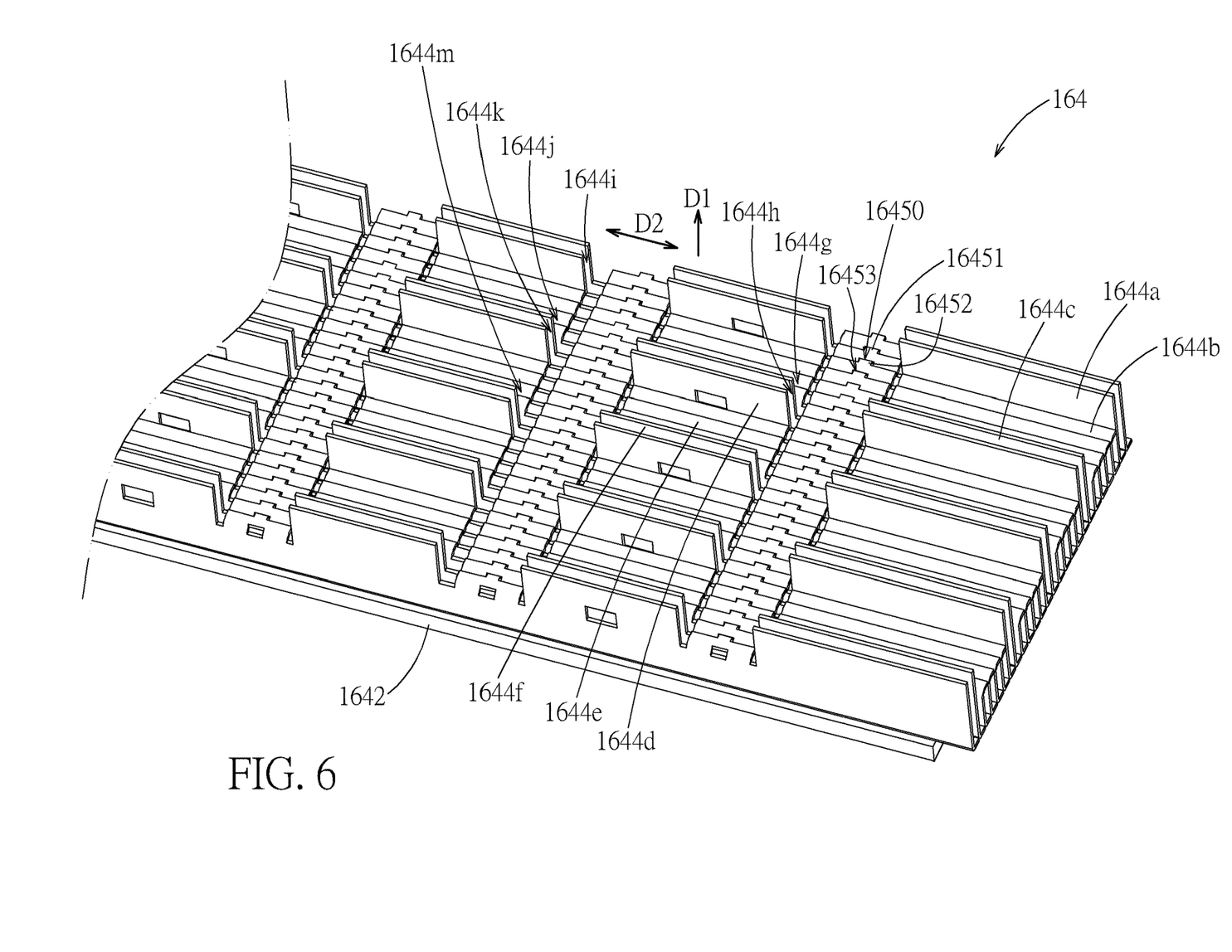
FIG. 6 is a schematic diagram illustrating one of the heat-dissipating structures in FIG. 4.

In the embodiment, the fin 1644 can be a metal stamping part and is fixed to the upper surface 1642a of the base portion 1642 by soldering, using an adhesive (e.g. a thermal conductive adhesive), or other joining ways (e.g. fitting a side of the fin 1644 in a narrow long slot formed on the base portion 1642). Furthermore, any two adjacent fins 1644 are connected with each other to enhance the structural strength of the whole fins 1644. Take the first fin 1644a and the adjacent second fin 1644b for example; the first fin 1644a as a whole shows an L-shaped sectional profile and extends in the second direction D2. The first fin 1644a includes a first plate 16442 and a first fixing portion 16444. The first fin 1644a is fixed to the base portion 1642 through the first fixing portion 16444. The second fin 1644b as a whole shows a C-shaped sectional profile and extends in second direction D2. The second fin 1644b includes a second plate 16446, a second fixing portion 16448, and a top 16449. The second fixing portion 16448 and the top 16449 are connected to two opposite sides of the second plate 16446 respectively. The second fin 1644b is fixed to the base portion 1642 through the second fixing portion 16448. The first fin 1644a further includes a first joining portion 16450 on the first plate 16442; correspondingly, the second fin 1644b includes a second joining portion 16452. The first joining portion 16450 and the second joining portion 16452 are joined. Therein, the first joining portion 16450 is a depression. The second joining portion 16452 is a tab. The first joining portion 16450 and the second joining portion 16452 are joined by the tab fitting in the depression. In practice, the first joining portion 16450 can be a tab while the second joining portion 16452 is a depression. Furthermore, in the embodiment, the first fin 1644a includes another joining portion 16451 for connecting with another adjacent fin 1644 (which is located at another side of the first fin 1644a opposite to the second fin 1644b). Similarly, the second fin 1644b includes another joining portion 16453 for connected with another adjacent fin 1644 (which is located at another side of the second fin 1644b opposite to the first fin 1644a). In the embodiment, the joining portion 16451 and the second joining portion 16452 have the same structure. The joining portion 16453 and the first joining portion 16450 have the same structure. However, it is not limited thereto in practice.

Furthermore, in the embodiment, the fins 1644 also includes a third fin 1644c disposed adjacent to the at least one second fin 1644b and opposite to the first fin 1644a. The third fin 1644c protrudes relative to the base portion 1642 longer than the second fin 1644b. A protruding height H3 of the third fin 1644c from top upper surface 1642a of the base portion 1642 in the first direction D1 is larger than the protruding height H2 of the second fin 1644b from the upper surface 1642a of the base portion 1642 in the first direction D1, so the first fin 1644a, the at least one second fin 1644b, and the third fin 1644c form the first accommodating space 1646 therebetween. Furthermore, the fins 1644 further include a fourth fin 1644d, at least one fifth fin 1644e, and a sixth fin 1644f. The fourth fin 1644d, the at least one fifth fin 1644e, and the sixth fin 1644f forma second accommodating space 1648 (indicated by a dashed frame in FIG. 5). The fourth fin 1644d, the fifth fin 1644e, and the sixth fin 1644f have the same structural logic as the first fin 1644a, the second fin 1644b, and the third fin 1644c; therefore, for other descriptions about the fourth fin 1644d, the fifth fin 1644e, and the sixth fin 1644f, please refer to the above relevant descriptions, which will not be repeated in addition.

In addition, in the embodiment, the base portion 1642 can be realized by a metal plate (e.g. a copper plate, an aluminum plate); however, it is not limited thereto in practice. For example, the base portion 1642 can be realized by a combination of a metal plate and a heat tube, a vapor chamber (or a planar heat tube), or other objects capable of transferring heat. Furthermore, the base portion 1642 and the fins 1644 also can be realized by a single structure part, for example realized by aluminum extrusion, die casting, or other proper manufacturing methods.

Figure 3:
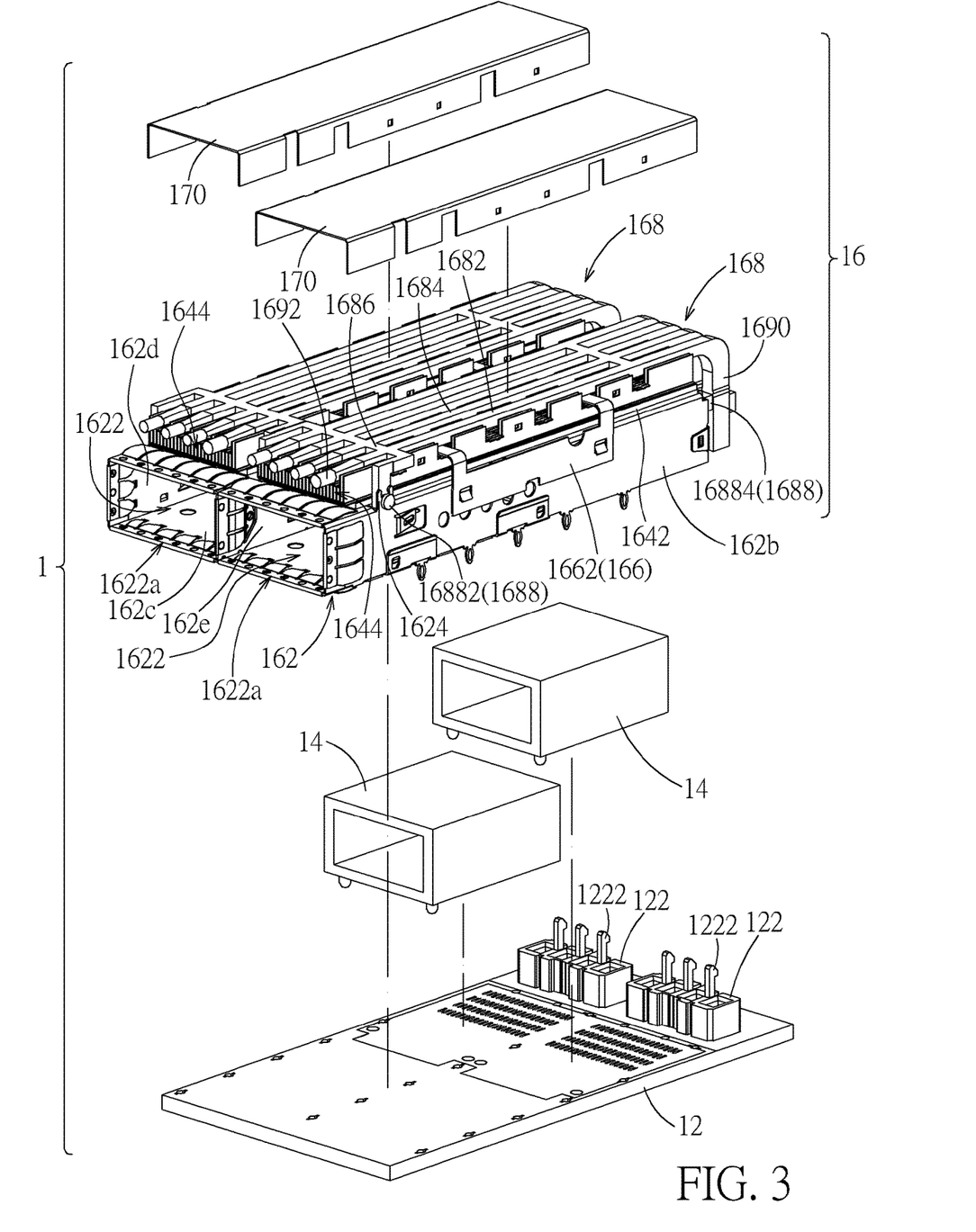
FIG. 3 is a partially exploded view of the electrical connector in FIG. 1.
Figure 4:
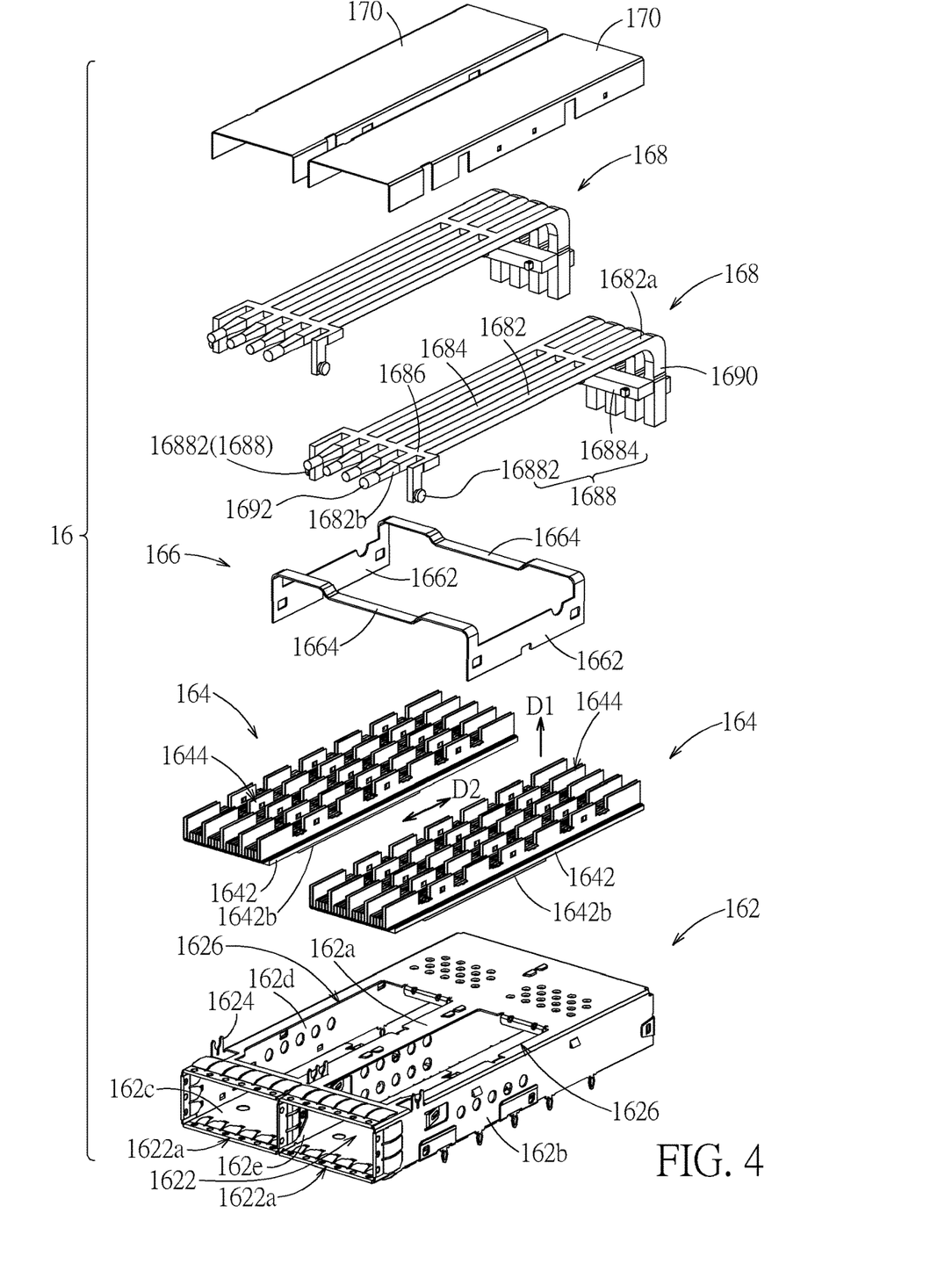
FIG. 4 is an exploded view of an electrical connector cage assembly of the electrical connector in FIG. 1.

As shown by FIG. 3 and FIG. 4, the light-guiding part 168 includes a first light-guiding rod body 1682, a second light-guiding rod body 1684, a connection portion 1686, and a fixing structure 1688. The first light-guiding rod body 1682 and the second light-guiding rod body 1684 extend parallel to each other in the second direction D2. The connection portion 1686 connects the first light-guiding rod body 1682 and the second light-guiding rod body 1684 in a direction perpendicular to the first direction D1 and the second direction D2. The light-guiding part 168 is disposed above the heat-dissipating structure 164. Therein, the first light-guiding rod body 1682 and the second light-guiding rod body 1684 are accommodated in the first accommodating space 1646 and the second accommodating space 1648 (indicated by dashed frames in FIG. 5) respectively. The first light-guiding rod body 1682 and the second light-guiding rod body 1684 are parallel to the fins 1644. In practice, it is practicable to set the protruding heights H1 and H2 of the fins 1644 so as to accommodate the first light-guiding rod body 1682 and the second light-guiding rod body 1684 wholly in the first accommodating space 1646 and the second accommodating space 1648. This structural configuration can increase the space usage and is also conducive to the heat dissipation efficiency. Furthermore, because the first light-guiding rod body 1682 and the second light-guiding rod body 1684 are parallel to the fins 1644, the influence on the flowing of heat-dissipating airflow through the fins 1644 by the first light-guiding rod body 1682 and the second light-guiding rod body 1684 can be reduced.

Figure 7:
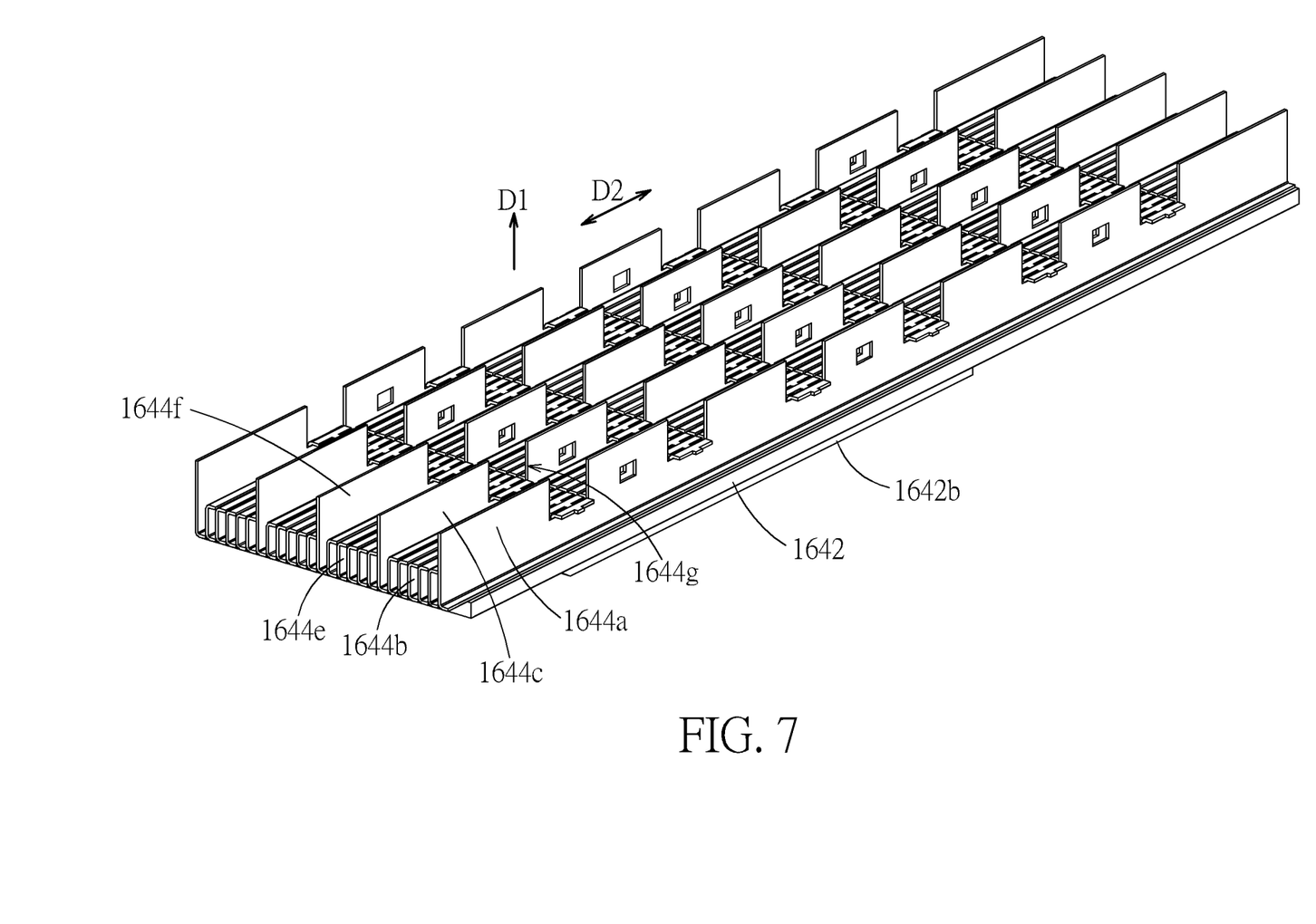
FIG. 7 is a schematic diagram illustrating the heat-dissipating structure in FIG. 4 according to an embodiment.
Figure 8:
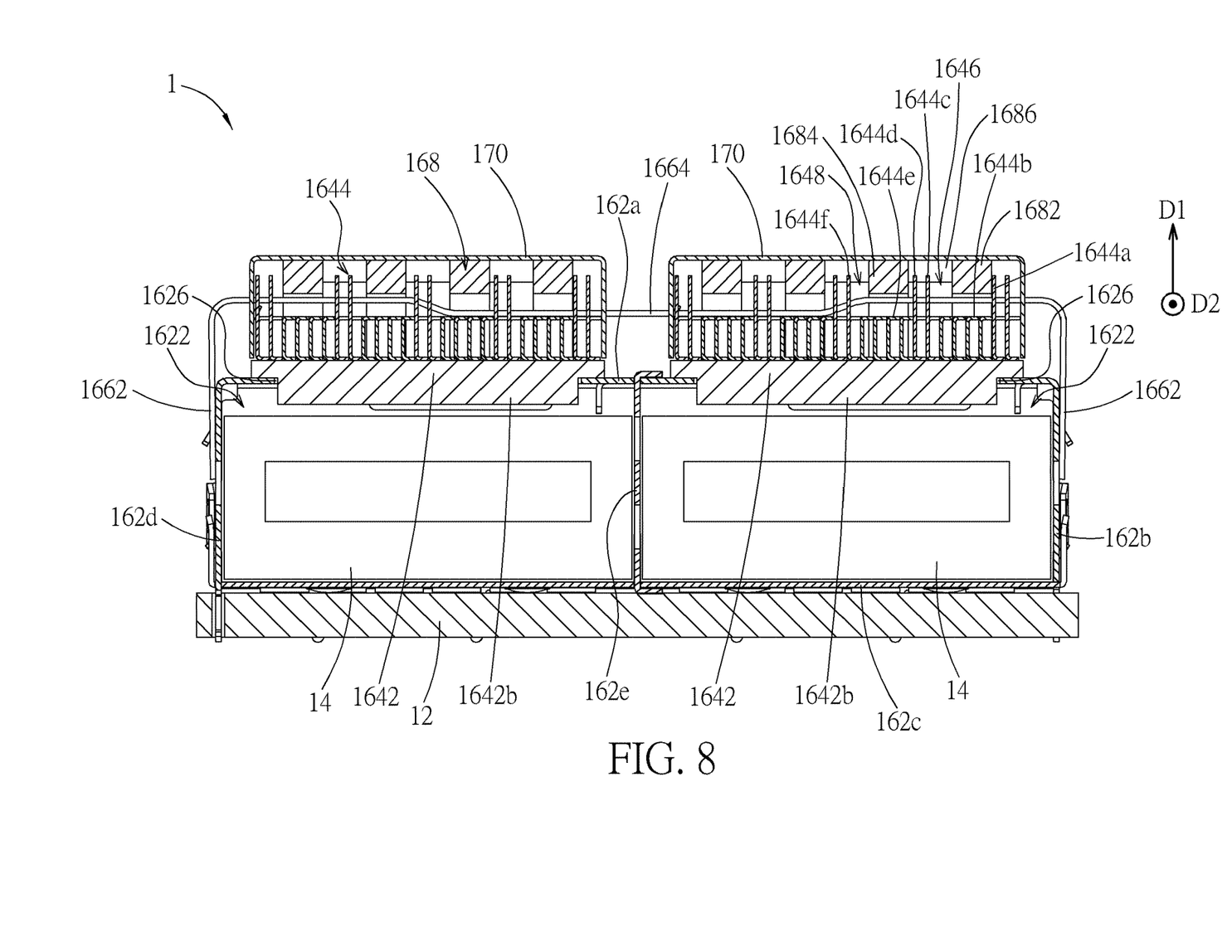
FIG. 8 is a sectional view of the electrical connector along the line X-X in FIG. 1.
Figure 9:
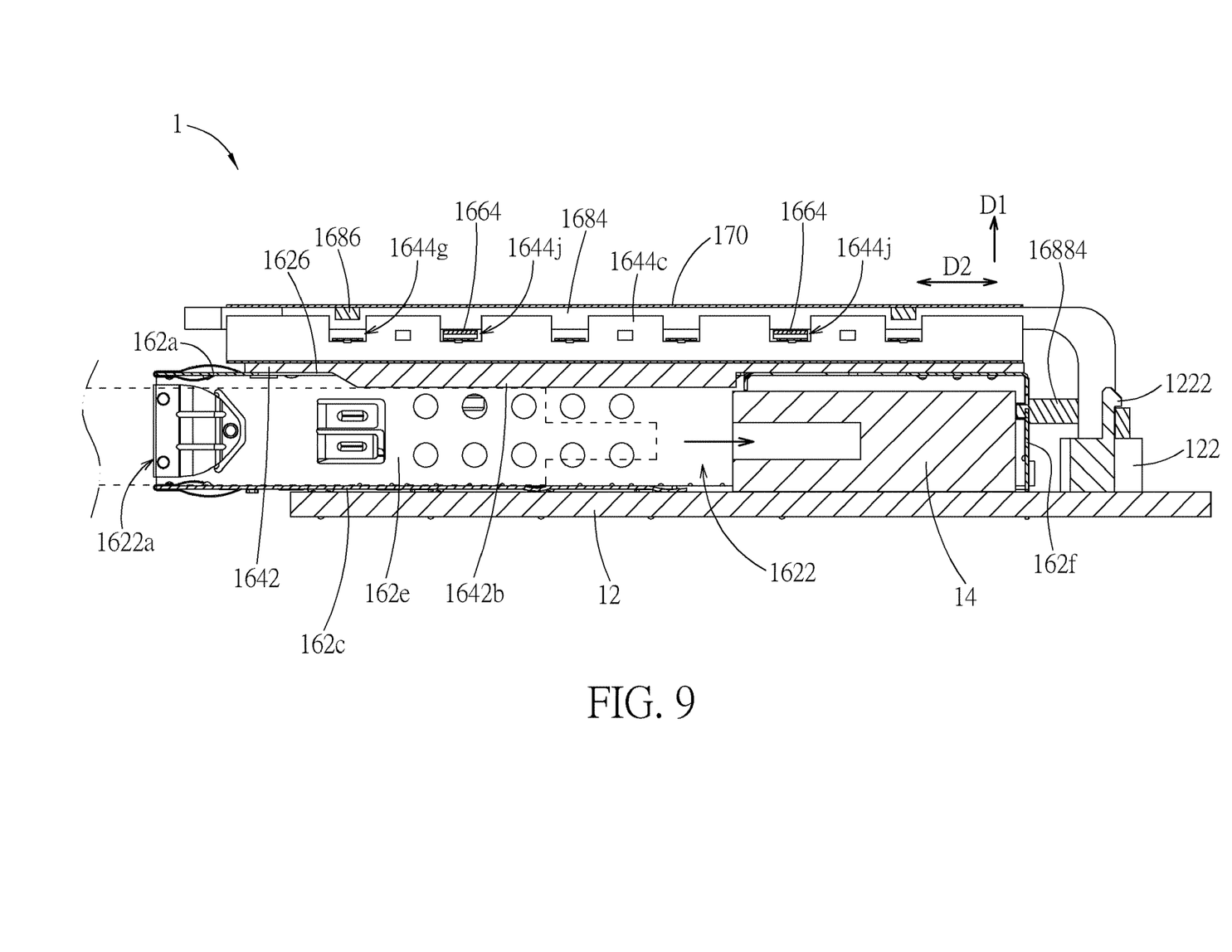
FIG. 9 is a sectional view of the electrical connector along the line Y-Y in FIG. 1.

Furthermore, in the embodiment, the third fin 1644c and the fourth fin 1644d are disposed adjacent to each other and have a notches 1644g and 1644h respectively. The first accommodating space 1646 and the second accommodating space 1648 communicate with each other through the notches 1644g and 1644h. The connection portion 1686 passes through the notches 1644g and 1644h to connect the first light-guiding rod body 1682 and the second light-guiding rod body 1684. If the connection portion 1686 does not overlap the fins 1644 in the first direction D1, the notches 1644g and 1644h also can be skipped. In addition, in practice, if there are more fins 1644 between the first accommodating space 1646 and the second accommodating space 1648, these fins 1644 also form notches so that the first accommodating space 1646 and the second accommodating space 1648 can communicate with each other through these notches (including the notches 1644g and 1644h). Similarly, if there is only one fin between the first accommodating space 1646 and the second accommodating space 1648 (i.e. the third fin 1644c and the fourth fin 1644d are the same fin), for an example that, as shown by FIG. 7, only the third fin 1644c is disposed between the first accommodating space 1646 and the second accommodating space 1648, the first accommodating space 1646 and the second accommodating space 1648 communicate with each other through the notch 1644g. The connection portion 1686 (not shown in FIG. 7) passes through the notch 1644g to connect the first light-guiding rod body 1682 and the second light-guiding rod body 1684.

In addition, as shown by FIG. 3 and FIG. 5, in the embodiment, the heat-dissipating structure 164 includes a plurality of accommodating spaces (including the first accommodating space 1646 and the second accommodating space 1648). The light-guiding part 168 includes a plurality of light-guiding rod bodies (including the first light-guiding rod body 1682 and the second light-guiding rod body 1684) correspondingly. The light-guiding rod bodies are accommodated in the accommodating spaces respectively. In practice, the light-guiding rod body and the accommodating space are not limited to have the same quantity. For example, one accommodating space can be enlarged to accommodate several light-guiding rod bodies. Furthermore, in practice, the accommodating spaces are not limited to have the same size, and the light-guiding rod bodies are not limited to have the same size. Furthermore, the thickness of the connection portion 1686 (in the view point of FIG. 5) can be reduced more in practice, so as to further reduce the influence on the flowing of heat-dissipating airflow through the fins 1644 by the connection portion 1686.

Figure 1:
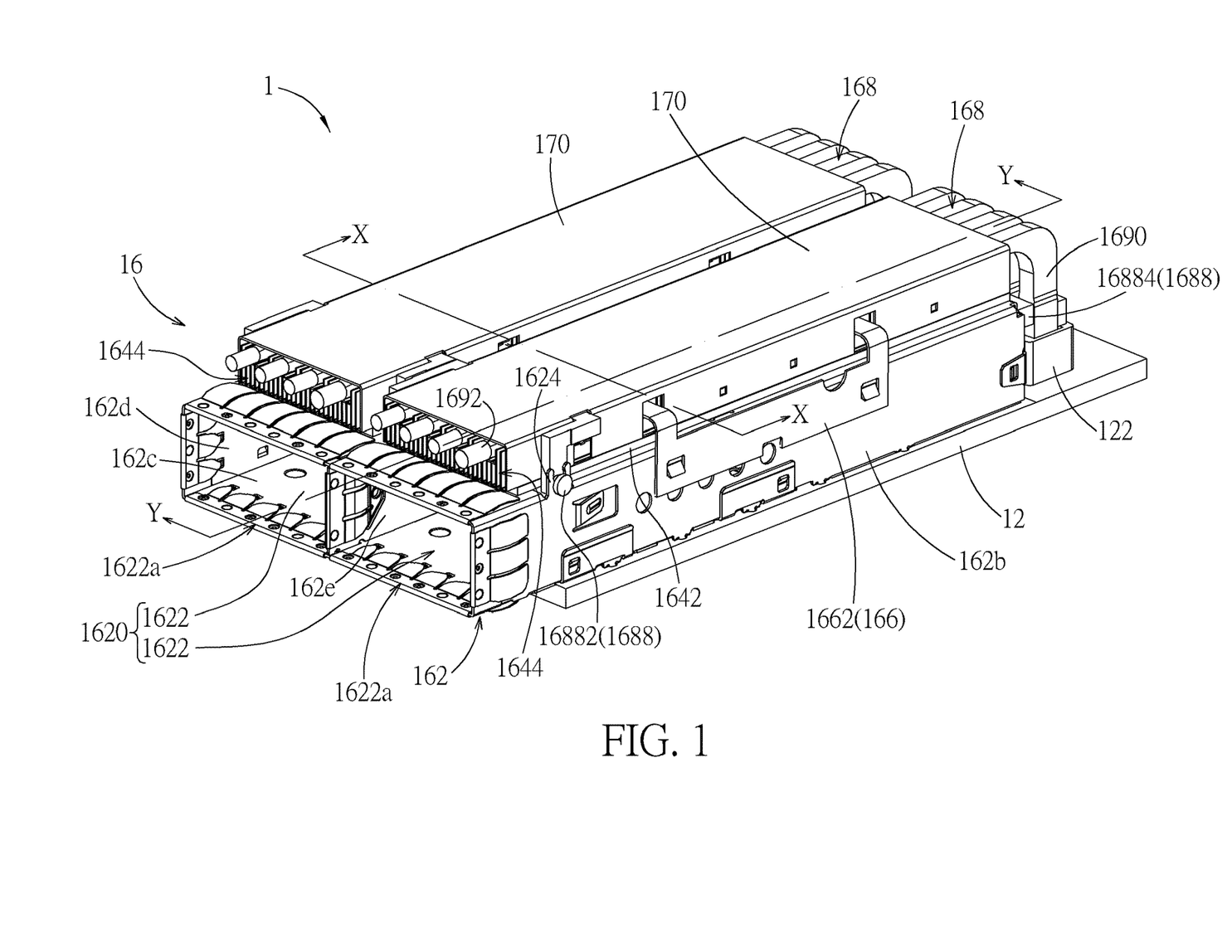
FIG. 1 is a schematic diagram illustrating an electrical connector of an embodiment according to the invention.
Figure 2:
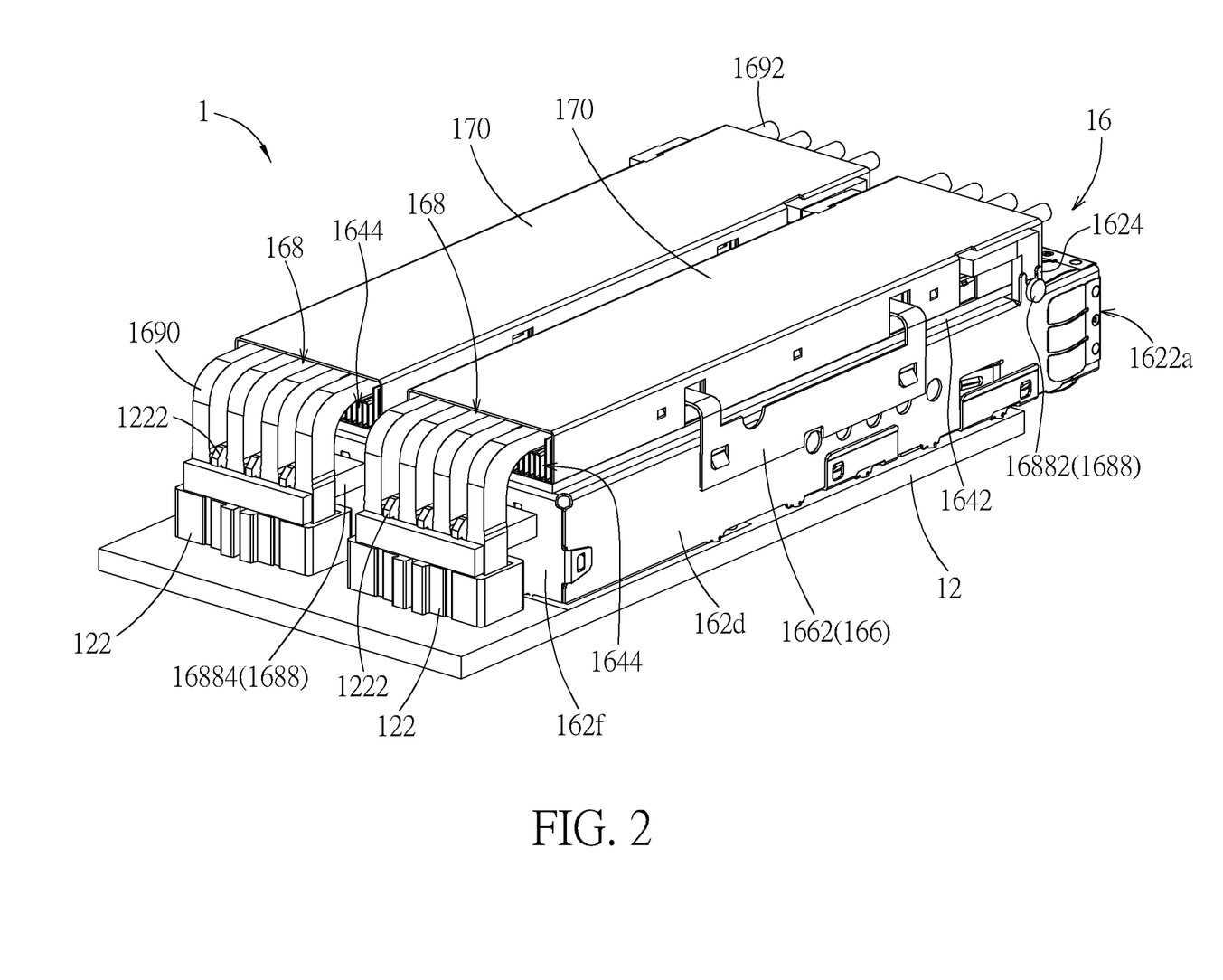
FIG. 2 is a schematic diagram illustrating the electrical connector in FIG. 1 in another view point.

Please refer to FIG. 2 to FIG. 4. The light-guiding part 168 is fixed to the connector casing 162 through the fixing structure 1688. Therein, the connector casing 162 includes a plurality of clamping portions 1624. The fixing structure 1688 includes a plurality of protruding portions 16882 and an abutting portion 16884. The protruding portions 16882 fit in the clamping portion 1624. The abutting portion 16884 abuts against an outer side wall 162f of the rear side of the connector casing 162 (opposite to the inlet 1622a); however, it is not limited thereto in practice. For example, it is practicable to directly fix or just place the light-guiding part 168 on the fins 1644. For the first light-guiding rod body 1682, the light-guiding part 168 further includes a light-input portion 1690 and a light-output portion 1692 connected to two end portions 1682a and 1682b of the first light-guiding rod body 1682 respectively. The light-input portion 1690 extends toward the connector casing 162 (or toward the circuit board 12) and is connected with the light-blocking sheath 122. The light source is located inside the light-blocking sheath 122, so that the light-input portion 1690 can receive light emitted by a light-emitting part (e.g. but not limited to a light-emitting diode) of the light source. Therein, the light-blocking sheath 122 can prevent leakage of light (i.e. the light emitted by the light source leaks out of the light-blocking sheath 122). The light is guided by the first light-guiding rod body 1682 to be emitted out the light-guiding part 168 through the light-output portion 1692. Similarly, for the second light-guiding rod body 1684, the light-guiding part 168 also includes a corresponding light-input portion and a corresponding light-output portion, which have the same structure as the light-input portion 1690 and the light-output portion 1692 and will not be described for structural details thereof in addition. Furthermore, in the embodiment, the light-blocking sheath 122 includes a hooking structure 1222. The hooking structure 1222 hooks the fixing structure 1688 (or the abutting portion 16884 thereof), which helps the light-blocking sheath 122 to stably fixedly connect with the light-guiding part 168 and also is conducive to the alignment of the light-input portion 1690 with the light source (or the light-emitting part thereof).

Please refer to FIG. 1 to FIG. 6, FIG. 8 and FIG. 9. The elastic attaching part 166 has an n-shaped sectional profile in the second direction D2 and has a rectangular profile in the first direction D1. The elastic attaching part 166 includes two engaging portions 1662 and two elastic portions 1664. The two elastic portions 1664 connect the two engaging portions 1662. The elastic attaching part 166 is across the two heat-dissipating structures 164 and is engaged to the connector casing 162 through the two engaging portions 1662 to elastically clamp the two heat-dissipating structures 164 between the two elastic portions 1664 and the outer side wall 162a of the connector casing 162. Therein, the engaging portions 1662 use locking holes to engage with locking hooks on the two opposite outer side wall 162b and 162d of the connector casing 162; however, it is not limited thereto in practice. For example, it is practicable for the elastic attaching part 166 to install the two heat-dissipating structures 164 to the connector casing 162 by a pivot connection at one end portion of the elastic attaching part 166 and a hook connection at another end portion of the elastic attaching part 166. The first fin 1644a, the third fin 1644c, the fourth fin 1644d, and the sixth fin 1644f have two notches 1644i, two notches 1644j, two notches 1644k, and two notches 1644m respectively for the two elastic portions 1664 to pass through, so that the two elastic portions 1664 elastically abut downward against the fins 1644 and are located between the first and second light-guiding rod bodies 1682 and 1684 and the heat-dissipating structures 164. Because the second fin 1644b and the fifth fin 1644e are lower than the first fin 1644a, the third fin 1644c, the fourth fin 1644d, and the sixth fin 1644f, so that the elastic portions 1664 can directly pass through above the fins 1644b and 1644e, it is unnecessary to form notches on the fins 1644b and 1644e; however, it is not limited thereto in practice. For example, all the fins 1644 have notches for the elastic portions 1664 to pass through. For another example, there is no fin 1644 on portions of the base portion 1642 corresponding to the elastic portions 1664, so that the elastic portions 1664 can directly abut against the base portion 1642 of the heat-dissipating structure 164 to install the heat-dissipating structure 164 to the connector casing 162.

Furthermore, in the embodiment, the outer side wall 162a of the connector casing 162 has two windows 1626 corresponding to the two insertion slots 1622 respectively. The base portion 1642 of the heat-dissipating structure 164 has two protruding portions 1642b corresponding the two windows 1626. The protruding portion 1642b protrudes downward and partially enters the corresponding insertion slot 1622 through the corresponding window 1626. Because of the elasticity of the elastic attaching part 166, the elastic attaching part 166 can allow the base portion 1642 (or the heat-dissipating structure 164) to move relative to the window 1626. Furthermore, the first light-guiding rod body 1682 is separated from the at least one second fin 1644b and the elastic attaching part 166 in a direction perpendicular to the base portion 1642; in other words, there is a gap between the first light-guiding rod body 1682 and the at least one second fin 1644b and between the first light-guiding rod body 1682 and the elastic attaching part 166 in the first direction D1, which is also applicable to the structural relationship between the other light-guiding rod bodies of the light-guiding part 168 and the fins 1644 and will not be repeated in addition. The gap allow the heat-dissipating structure 164 and the elastic portion 1664 to move relative to the light-guiding part 168 (and the connector casing 162) in the first direction D1. When an external connector (indicated by a dashed frame in FIG. 9) is inserted into the insertion slot 1622, the external connector can touch and push the protruding portion 1642b up, so that heat produced by the external connector during operation also can be dissipated through the heat-dissipating structure 164.

Please refer to FIG. 1 to FIG. 4. In the embodiment, the electrical connector cage assembly 16 further includes two outer covers 170 corresponding to the two heat-dissipating structures 164 respectively. The outer cover 170 covers the fins 1644 (e.g. the first fin 1644a, the second fin 1644b, and so on), the accommodating spaces formed by the fins 1644 (e.g. the first accommodating space 1646, the second accommodating space 1648, and so on), and the light-guiding rod bodies of the light-guiding part 168 (e.g. the first light-guiding rod body 1682, the second light-guiding rod body 1684, and so on). In practice, the outer cover 170 can protect structures (e.g. the light-guiding part 168, the fins 1644, and so on), guide the heat-dissipating airflow, shield light (e.g. the light leaking from the first light-guiding rod body 1682), and so on. In the embodiment, the outer cover 170 is connected to the outermost fins 1644 (e.g. the first fin 1644a) of the corresponding heat-dissipating structure 164; however, it is not limited thereto in practice. For example, it is practicable for the outer cover 170 to be connected to the second fin 1644b (e.g. the outer cover 170 extends downward to form a connection portion to connect with the second fin 1644b), the base portion 1642, or the connector casing 162.

Figure 10:
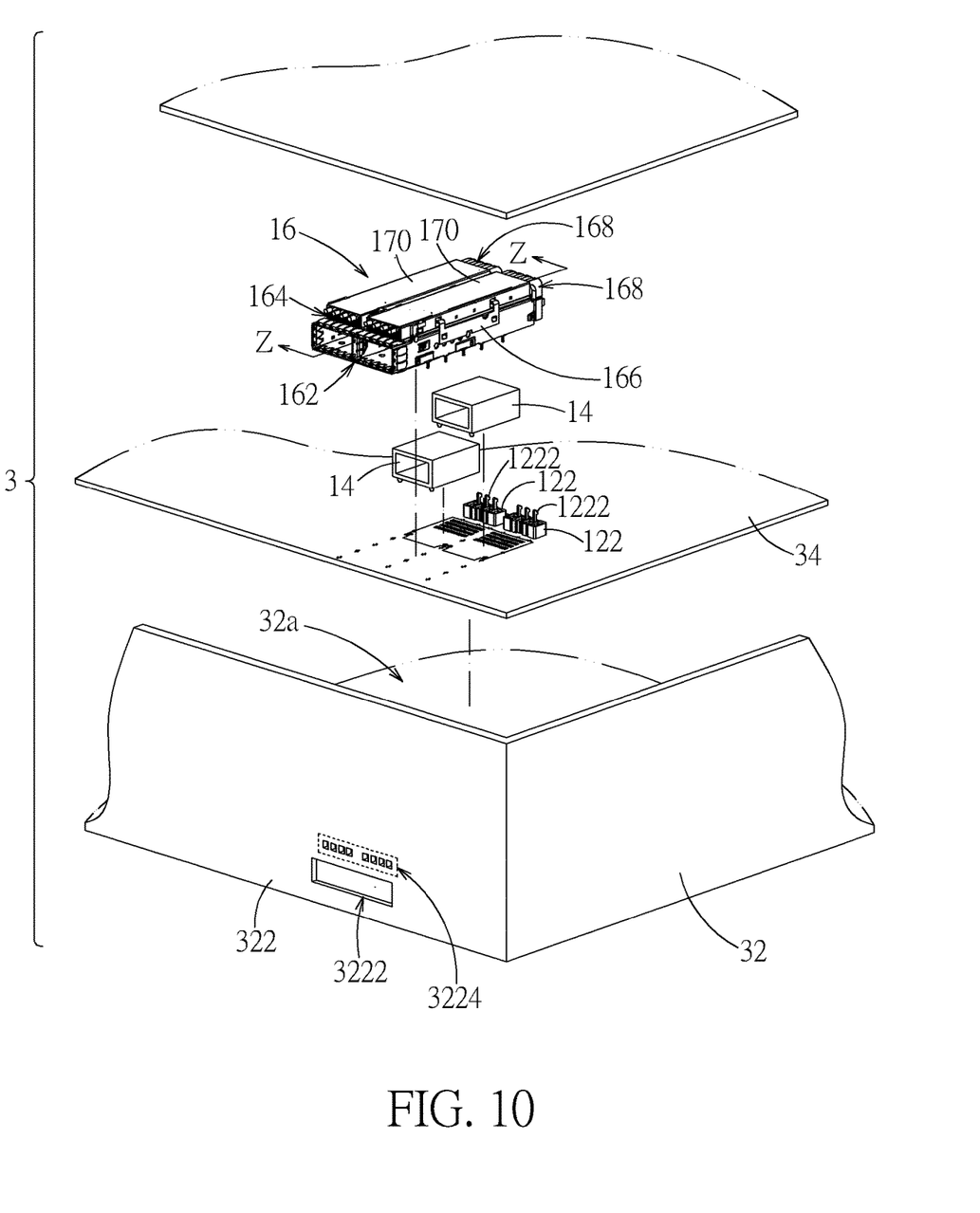
FIG. 10 is a partially exploded view of the electronic apparatus of an embodiment according the invention.
Figure 11:
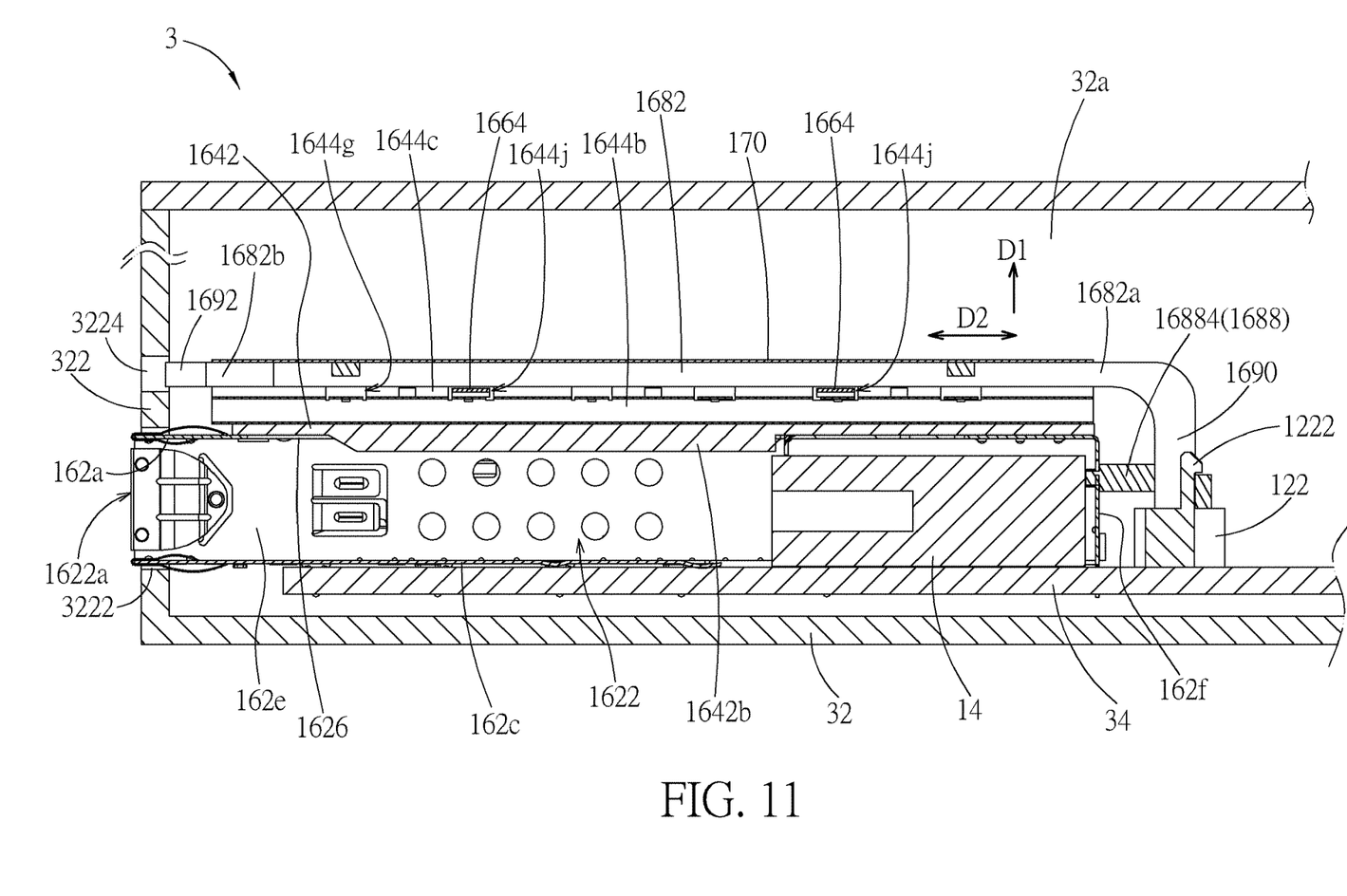
FIG. 11 is a sectional view of a portion of the electronic apparatus in FIG. 10, of which the position of the cutting plane is indicated by the line Z-Z in FIG. 10.

Please refer to FIG. 10 and FIG. 11. An electronic apparatus 3 (e.g. but not limited to a computer host) of an embodiment according to the invention includes an apparatus casing 32, a circuit board (e.g. but not limited to a system mainboard), and the above electrical connector bases 14 and electrical connector cage assembly 16. The apparatus casing 32 forms a space 32a. The circuit board 34 is disposed in the space 32a. The electrical connector cage assembly 16 is fixed onto the circuit board 34. The electrical connector bases 14 are electrically connected onto the circuit board 34 in the connector casing 162 and exposed in the corresponding insertion slots 1622. For the other descriptions of the electrical connector base 14 and the electrical connector cage assembly 16, please refer to the relevant descriptions in the foregoing, which will not be repeated in addition. In the embodiment, the apparatus casing 32 includes a panel 322 (e.g. structurally integrated into a rear side plate thereof). The panel 322 has an opening 3222 and a light-permeable structure 3224 (indicated by a dashed frame in FIG. 10). The light-permeable structure 3224 is realized by a plurality of holes; however, it is not limited thereto in practice. For example, the light-permeable structure 3224 is realized by a plurality of light-permeable rods embedded in the panel 322, or by a single window or a single light-permeable rod; therein, the light-permeable rod is not limited to being totally transparent. The electrical connector cage assembly 16 is disposed toward the opening 3222 and the light-permeable structure 3224, so that the inlet 1622a of the insertion slot 1622 of the connector casing 162 is aligned with the opening 3222, and the light-output portions of the light-guiding rod bodies of the light-guiding part 168 (including the light-output portion 1692 and so on) are aligned with the light-permeable structure 3224 (or corresponding through holes). Thereby, light emitted out the light-guiding part 168 through the light-output portion 1692 can be seen by a user outside the apparatus casing 32 through the light-permeable structure 3224, which produces an optical indication effect (e.g. according to the operating status of the electrical connector base 14).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An electrical connector cage assembly, comprising:
a connector casing, having an outer side wall;
a heat-dissipating structure, disposed on the outer side wall, the heat-dissipating structure comprising a base portion and a first fin and at least one second fin that protrude from the base portion, the first fin comprising a first joining portion, the second fin comprising a second joining portion, the first joining portion and the second joining portion being joined, the first fin and the at least one second fin extending parallel to each other and the base portion, the first fin protruding relative to the base portion longer than the at least one second fin, so that a first accommodating space is formed above the at least one second fin, the first accommodating space extending parallel to the first fin and the at least one second fin; and
a light-guiding part, disposed above the heat-dissipating structure, the light-guiding part comprising a first light-guiding rod body, the first light-guiding rod body being accommodated in the first accommodating space.

2. The electrical connector cage assembly according to claim 1, wherein the first light-guiding rod body is parallel to the first fin and the at least one second fin.

3. The electrical connector cage assembly according to claim 1, wherein the heat-dissipating structure comprises a third fin protruding from the base portion, the third fin is disposed opposite to the first fin and adjacent to the at least one second fin, the third fin extends parallel to the first fin, the at least one second fin, and the base portion, the third fin protrudes relative to the base portion longer than the at least one second fin, and the first fin, the at least one second fin, and the third fin commonly form the first accommodating space.

4. The electrical connector cage assembly according to claim 3, wherein the heat-dissipating structure comprises a fourth fin and at least one fifth fin that are connected to the base portion, the fourth fin and the at least one fifth fin extend parallel to each other and the base portion, the fourth fin protrudes relative to the base portion longer than the fifth fin, so that a second accommodating space is formed above the at least one fifth fin, the second accommodating space extends parallel to the fourth fin and the at least one fifth fin, the light-guiding part comprises a second light-guiding rod body, and the second light-guiding rod body is accommodated in the second accommodating space.

5. The electrical connector cage assembly according to claim 4, wherein the third fin and the fourth fin are disposed adjacent and parallel to each other, each of the third fin and the fourth fin has a notch, the first accommodating space and the second accommodating space communicate through the two notches, the light-guiding part comprises a connection portion, and the connection portion passes through the two notches to be connected to the first light-guiding rod body and the second light-guiding rod body.

6. The electrical connector cage assembly according to claim 4, wherein the third fin and the fourth fin are the same fin and have a notch, the first accommodating space and the second accommodating space communicate through the notch, the light-guiding part comprises a connection portion, and the connection portion passes through the notch to be connected to the first light-guiding rod body and the second light-guiding rod body.

7. The electrical connector cage assembly according to claim 1, wherein one of the first joining portion and the second joining portion is a tab, the other one of the first joining portion and the second joining portion is a depression, and the first joining portion and the second joining portion are joined by the tab fitting in the depression.

8. The electrical connector cage assembly according to claim 1, wherein the first fin has a first fixing portion, the second fin has a second fixing portion, the first fixing portion and the second fixing portion extend parallel to the base portion, and the first fin and the second fin are fixed to the base portion through the first fixing portion and the second fixing portion respectively.

9. The electrical connector cage assembly according to claim 1, wherein the first fin and the at least one second fin are fixed to the base portion through a thermal conductive adhesive or by soldering.

10. The electrical connector cage assembly according to claim 1, wherein the light-guiding part comprises a light-input portion, and the light-input portion is connected to an end portion of the first light-guiding rod body and extends toward the connector casing.

11. The electrical connector cage assembly according to claim 1, wherein the light-guiding part comprises a fixing structure, and the light-guiding part is fixed to the connector casing through the fixing structure.

12. The electrical connector cage assembly according to claim 1, further comprising an outer cover, wherein the outer cover covers the first fin, the at least one second fin, the first accommodating space, and the first light-guiding rod body.

13. The electrical connector cage assembly according to claim 12, wherein the outer cover is connected to the first fin, the second fin, the base portion, or the connector casing.

14. The electrical connector cage assembly according to claim 1, wherein the first light-guiding rod body is separated from the at least one second fin in a direction perpendicular to the base portion.

15. The electrical connector cage assembly according to claim 1, further comprising an elastic attaching part, wherein the connector casing forms an insertion slot, the outer side wall has a window, the window and the insertion slot communicate, the base portion partially enters the insertion slot through the window, the elastic attaching part is engaged to the connector casing to elastically clamp the heat-dissipating structure between the elastic attaching part and the outer side wall, and the base portion is movable relative to the window.

16. The electrical connector cage assembly according to claim 15, wherein the elastic attaching part passes through the first fin and is located above the at least one second fin.

17. An electrical connector, comprising:
a circuit board;
an electrical connector cage assembly, fixed on the circuit board, the electrical connector cage assembly comprising:
 a connector casing, having an outer side wall and forming an insertion slot;
 a heat-dissipating structure, disposed on the outer side wall, the heat-dissipating structure comprising a base portion and a first fin and at least one second fin that protrude from the base portion, the first fin comprising a first joining portion, the second fin comprising a second joining portion, the first joining portion and the second joining portion being joined, the first fin and the at least one second fin extending parallel to each other and the base portion, the first fin protruding relative to the base portion longer than the at least one second fin, so that an accommodating space is formed above the at least one second fin, the accommodating space extending parallel to the first fin and the at least one second fin; and
 a light-guiding part, disposed above the heat-dissipating structure, the light-guiding part comprising a light-guiding rod body, the light-guiding rod body being accommodated in the accommodating space; and
an electrical connector base, electrically connected onto the circuit board in the connector casing and exposed in the insertion slot.

18. An electronic apparatus, comprising:
an apparatus casing, comprising a panel, the panel having a light-permeable structure;
a circuit board, disposed in the apparatus casing;
an electrical connector cage assembly, fixed on the circuit board, the electrical connector cage assembly comprising:
 a connector casing, having an outer side wall;
 a heat-dissipating structure, disposed on the outer side wall, the heat-dissipating structure comprising a base portion and a first fin and at least one second fin that protrude from the base portion, the first fin comprising a first joining portion, the second fin comprising a second joining portion, the first joining portion and the second joining portion being joined, the first fin and the at least one second fin extending parallel to each other and the base portion, the first fin protruding relative to the base portion longer than the at least one second fin, so that an accommodating space is formed above the at least one second fin, the accommodating space extending parallel to the first fin and the at least one second fin; and
 a light-guiding part, disposed above the heat-dissipating structure, the light-guiding part comprising a light-guiding rod body and a light-output portion, the light-guiding rod body being accommodated in the accommodating space, the light-output portion being connected to an end portion of the light-guiding rod body toward the light-permeable structure; and
an electrical connector base, electrically connected onto the circuit board in the connector casing and exposed in the insertion slot.

\* \* \* \* \*